(12) United States Patent
Peng et al.

(10) Patent No.: US 11,508,804 B2
(45) Date of Patent: Nov. 22, 2022

(54) ORGANIC LIGHT EMITTING DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Liman Peng, Beijing (CN); Qi Liu, Beijing (CN); Dianjie Hou, Beijing (CN); Xueguang Hao, Beijing (CN); Jin Yang, Beijing (CN); Zihua Li, Beijing (CN); Yan Wu, Beijing (CN); Guoping Zhang, Beijing (CN); Haifeng Xu, Beijing (CN); Lei Wang, Beijing (CN); Wenxiu Li, Beijing (CN); Jianqiang Wang, Beijing (CN); Fan Yang, Beijing (CN)

(73) Assignees: ORDOS YUANSHENG OPTOELECTRONICS, CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 26 days.

(21) Appl. No.: 17/181,124

(22) Filed: Feb. 22, 2021

(65) Prior Publication Data

US 2021/0175320 A1 Jun. 10, 2021

Related U.S. Application Data

(63) Continuation-in-part of application No. 15/970,996, filed on May 4, 2018, now Pat. No. 10,964,774.

(30) Foreign Application Priority Data

Nov. 29, 2017 (CN) .......................... 201711228278.4

(51) Int. Cl.
*H01L 27/32* (2006.01)

(52) U.S. Cl.
CPC ...... *H01L 27/3279* (2013.01); *H01L 27/3265* (2013.01)

(58) Field of Classification Search
CPC ............ H01L 27/3279; H01L 27/3262; H01L 27/124; H01L 27/3276; H01L 27/3225;
(Continued)

(56) References Cited

U.S. PATENT DOCUMENTS 5,659,514 A * 8/1997 Hazani ................... G11C 16/08
365/201
10,254,864 B2 * 4/2019 Kim ................... G02F 1/136209
(Continued)

FOREIGN PATENT DOCUMENTS

CN 104124267 A 10/2014
CN 104464589 A 3/2015
(Continued)

OTHER PUBLICATIONS

Advisory Action from U.S. Appl. No. 15/970,996 dated Apr. 16, 2020.
(Continued)

*Primary Examiner* — Lawrence C Tynes, Jr.
(74) *Attorney, Agent, or Firm* — Calfee, Halter & Griswold LLP

(57) ABSTRACT

The present disclosure discloses an organic light emitting display device. The organic light emitting display device includes a substrate, an initializing voltage input line, a first electrode line, a thin film transistor, and an organic light emitting diode arranged on the substrate. The thin film transistor includes a first electrode, a second electrode and a control electrode, and the first electrode is coupled to the first electrode line, the initializing voltage input line is
(Continued)

provided in the same layer and is made of the same material as one of the first electrode, the second electrode and the control electrode of the thin film transistor, and an extension direction of the initializing voltage input line is substantially the same as an extension direction of the first electrode line.

20 Claims, 5 Drawing Sheets

(58) Field of Classification Search
CPC ............ H01L 27/3244; H01L 27/3281; H01L 29/4908; H01L 29/45; H01L 51/56; H01L 51/5206; H01L 2227/323
See application file for complete search history.

(56) References Cited

U.S. PATENT DOCUMENTS

| | | | |
|---|---|---|---|
| 2011/0090184 A1 | 4/2011 | Yamazaki | |
| 2014/0319480 A1 | 10/2014 | Kang | |
| 2014/0347349 A1 | 11/2014 | Kim | |
| 2014/0353616 A1* | 12/2014 | Park | G09G 3/3233 438/34 |
| 2015/0316802 A1 | 11/2015 | Takanishi | |
| 2017/0207289 A1* | 7/2017 | Kang | H01L 27/3265 |
| 2017/0317159 A1* | 11/2017 | Kim | H01L 27/3246 |
| 2018/0151831 A1* | 5/2018 | Lee | H01L 51/5253 |

FOREIGN PATENT DOCUMENTS

| | | |
|---|---|---|
| CN | 104637437 A | 5/2015 |
| CN | 205081121 U | 3/2016 |

OTHER PUBLICATIONS

Advisory Action from U.S. Appl. No. 15/970,996 dated May 27, 2020.
Office action from U.S. Appl. No. 15/970,996 dated Jan. 10, 2020.
Office action from U.S. Appl. No. 15/970,996 dated Jul. 1, 2019.
Notice of Allowance from U.S. Appl. No. 15/970,996 dated Nov. 20, 2020.
Office action from Chinese Application No. 202110257449.6 dated Feb. 18, 2022.

* cited by examiner

ORGANIC LIGHT EMITTING DISPLAY DEVICE

CROSS REFERENCE

This application is a CIP of U.S. application Ser. No. 15/970,996, which claims the priority of Chinese Patent Application No. 201711228278.4 filed on Nov. 29, 2017, entitled "BACKPLANE FOR ORGANIC LIGHT EMITTING DISPLAY DEVICE AND METHOD FOR FABRICATING THE SAME, AND DISPLAY APPARATUS". The entire contents of this application are incorporated herein by reference.

TECHNICAL FIELD

The present disclosure relates to the field of display technology, and in particular, to a backplane for an organic light emitting display device, a method for fabricating the same, and an organic light emitting display apparatus.

BACKGROUND

With the development of science and technology and the optimization of integrated circuit technology, organic light emitting diode (OLED) display apparatuses have become leaders in the display field by virtue of their outstanding performance. OLED display technology has been widely used in mobile terminals, tablet computers, notebook computers, car audios, and televisions because of its advantages such as self-light emission, wide viewing angle, high contrast, low power consumption, and high reaction speed.

However, backplanes currently used for organic light emitting display devices, methods for fabricating the same, and organic light emitting display apparatuses still need to be improved.

SUMMARY

An aspect of the present disclosure provides an organic light emitting display device, including a substrate, an initializing voltage input line, a first electrode line, a thin film transistor, and an organic light emitting diode arranged on the substrate. The thin film transistor includes a first electrode, a second electrode and a control electrode, and the first electrode is coupled to the first electrode line, the initializing voltage input line is provided in the same layer and is made of the same material as one of the first electrode, the second electrode and the control electrode of the thin film transistor, and an extension direction of the initializing voltage input line is substantially the same as an extension direction of the first electrode line.

According to an embodiment of the present disclosure, the first electrode line is a data line of the organic light emitting display device, and the extension direction of the initializing voltage input line is substantially the same as an extension direction of the data line.

According to an embodiment of the present disclosure, the first electrode line is a power signal line of the organic light emitting display device, and the extension direction of the initializing voltage input line is substantially the same as an extension direction of the power signal line.

According to an embodiment of the present disclosure, the first electrode line is one of a data line and a power signal line of the organic light emitting display device, and the extension direction of the initializing voltage input line is substantially the same as extension directions of the data line and the power signal line.

According to an embodiment of the present disclosure, the organic light emitting display device further includes a scan line, and the extension direction of the initializing voltage input line is substantially perpendicular to an extension direction of the scan line.

According to an embodiment of the present disclosure, the organic light emitting display device further includes a reset signal line and a light emission control signal line, and extension directions of the reset signal line and the light emission control signal line are substantially the same as the extension direction of the scan line.

According to an embodiment of the present disclosure, the first electrode and the second electrode of the thin film transistor are a source and a drain respectively, and the initializing voltage input line is provided in the same layer and is made of the same material as the first electrode and the second electrode.

According to an embodiment of the present disclosure, the control electrode of the thin film transistor is a gate, and the initializing voltage input line is provided in the same layer and is made of the same material as the control electrode.

According to an embodiment of the present disclosure, the thin film transistor is a switching transistor in a pixel driving circuit of the organic light emitting display device, and the first electrode line is a data line of the organic light emitting display device.

According to an embodiment of the present disclosure, the initializing voltage input line and the data line are coupled to the same pixel driving circuit and are arranged adjacent to each other.

According to an embodiment of the present disclosure, the organic light emitting display device further includes a power signal line extending in substantially the same direction as the initializing voltage input line and the data line, and the data line, the initializing voltage input line and the power signal line are coupled to the same pixel driving circuit.

According to an embodiment of the present disclosure, the initializing voltage input line and the data line are arranged adjacent to each other, and the data line is arranged between the initializing voltage input line and the power signal line.

According to an embodiment of the present disclosure, the initializing voltage input line and the data line are arranged adjacent to each other, and the initializing voltage input line is arranged between the power signal line and the data line.

According to an embodiment of the present disclosure, the first electrode and the second electrode of the switching transistor, the initializing voltage input line and the data line are arranged in the same layer and made of the same material.

According to an embodiment of the present disclosure, the thin film transistor is a driving transistor in a pixel driving circuit of the organic light emitting display device, and the first electrode line is a power signal line of the organic light emitting display device.

According to an embodiment of the present disclosure, the initializing voltage input line and the power signal line are coupled to the same pixel driving circuit and are arranged adjacent to each other.

According to an embodiment of the present disclosure, the first electrode and the second electrode of the driving transistor, the initializing voltage input line and the power signal line are arranged in the same layer and made of the same material.

According to an embodiment of the present disclosure, the pixel driving circuit of the organic light emitting display device further includes a driving transistor and a first capacitor, and two plates of the first capacitor are respectively coupled to a control electrode of the driving transistor and the second electrode of the switching transistor.

According to an embodiment of the present disclosure, the pixel driving circuit of the organic light emitting display device further includes a second capacitor, and two plates of the second capacitor are respectively coupled to the control electrode and a first electrode of the driving transistor.

According to an embodiment of the present disclosure, the initializing voltage input line and the one of the first electrode, the second electrode and the control electrode of the thin film transistor are formed by a same patterning process.

BRIEF DESCRIPTION OF THE DRAWINGS

The above and/or additional aspects and advantages of the present disclosure will become apparent and easily understood from the following description of embodiments in conjunction with the accompanying drawings, in which.

LISTING OF REFERENCE NUMERALS

Figure 1:
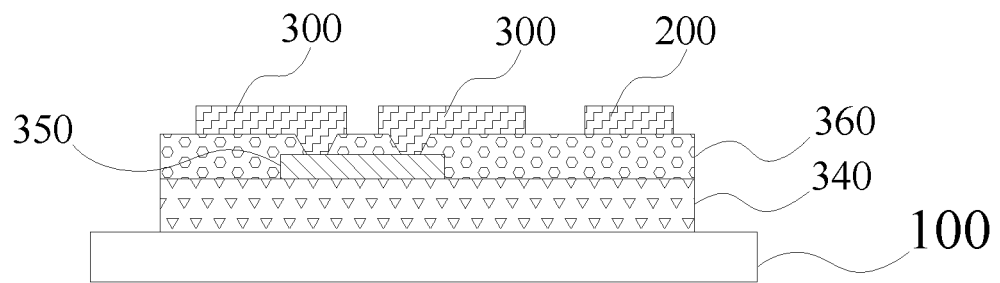
FIG. 1 shows a partial structural view of a backplane according to an embodiment of the present disclosure.

100: substrate; 200: initializing voltage input line; 300: electrode of thin film transistor; 310: first electrode; 320: second electrode; 330: control electrode; 31: first electrode line; 32: second electrode line; 33: control electrode line; 340: buffer layer; 350: active layer; 360: insulation layer; 400: reference voltage input line; 500: anode; 510: hole transport layer; 520: light emitting layer; 530: electron transport layer; 540: cathode; 50: anode line.

DETAILED DESCRIPTION

Embodiments of the present disclosure are described in detail below, examples of which are illustrated in the accompanying drawings, wherein the same or similar reference numerals denote the same or similar elements or elements having the same or similar functions throughout the drawings. The embodiments described below with reference to the accompanying drawings are exemplary, are used only for explaining the present disclosure, and should not be construed as limiting the present disclosure.

This disclosure is proposed based on the inventors' discovery and recognition of the following facts and problems.

The inventors have found that although the OLED display technology has been being increasingly developed and the fabricating process thereof is becoming more and more matured, the existing OLED display apparatuses still have many defects such as poor display. The inventors have found that the above-mentioned defects such as the horizontal stripe mura caused by arrangement of the OLED wiring (a phenomena of various tails caused by uneven brightness) are mainly because the existing OLEDs are mostly current-driven devices and are significantly influenced by the loading of various wirings, such as the data signal input (Vdata) line, the reference voltage input (Vref) line, the initializing voltage input (Vinit) line, etc. Fluctuation of the voltages on the above signal lines will influence the stable input of signals and the compensation of the switch threshold voltage (Vth) in the compensation circuit, resulting in uneven light emission of the OLED and horizontal stripe mura. Different wirings have different operating currents. For a wiring with a large operating current, when the wiring has a large resistance itself, its voltage will fluctuate greatly. More specifically, the inventors have found that the Vinit wiring has a large current when operating, and the anode with a large resistance is used to form the wiring, therefore the voltage fluctuation is large, which affects the stable input of signals and the compensation of Vth, resulting in uneven light emission and horizontal stripe mura. Therefore, if the above problems can be solved, the display effect of the OLED display apparatus will be greatly improved.

The present disclosure aims to alleviate or solve at least one of the above mentioned problems at least to some extent.

In one aspect of the present disclosure, the present disclosure provides a backplane for an organic light emitting display device. According to an embodiment of the present disclosure, referring to FIG. 1, the backplane includes a substrate 100 on which a wiring structure (not shown) and a thin film transistor (e.g., electrodes 300 of the thin film transistor, a buffer layer 340, an active layer 350, and an insulating layer 360 shown in FIG. 1) are provided. The wiring structure includes an initializing voltage input line 200 which is provided in the same layer and made of the same material as electrodes 300 of the thin film transistor.

According to an embodiment of the present disclosure, the electrodes 300 of the thin film transistor electrode may include at least one of a source, a drain, and a control electrode. In addition, the thin film transistor shown in FIG. 1 may have a bottom gate structure or a top gate structure, and the active layer 350 may be formed of a polysilicon (P-Si) material, an oxide semiconductor material or other semiconductor materials.

Thus, the backplane has at least one of the following advantages: the voltage signal of the initializing voltage input line is stable, which can significantly alleviate the horizontal stripe mura in the OLED; the structure of the backplane is simple, and can be obtained through a simple fabricating process, without significant change of the existing backplane fabricating process.

For easy understanding, the principle by which the backplane achieves the above technical effects will be described in detail below.

As described above, in the existing OLED display apparatus, the Vinit line is usually formed by the anode layer of the organic light emitting diode having a relatively large resistance. Since the anode layer of the organic light emitting diode needs both electric conductivity and light transmission, it has to be formed using ITO material. Since ITO has a large resistance (approximately $5.0\times10^{-4}$ $\Omega\cdot$cm), the horizontal stripe mura occurs. In order to improve the electric conductivity of the anode layer, other metals with high conductivity may be added to the anode material, for example, a composite material of three metal layers of ITO/Ag/ITO is used for the anode. However, since it has to consider at the same time the light transmission property of the anode layer, the improved anode layer still has a large resistance and cannot really alleviate the aforesaid problems caused by the large resistance of the Vinit line.

The inventors have found that if the Vinit line is provided in the same layer and made of the same material as electrodes of the thin film transistor, the above problems can be greatly alleviated. Generally, the material for forming the electrodes of the thin film transistor has a smaller resistance than the anode layer of the organic light emitting diode. For example, the Vinit line is formed of a composite material of three metal layers of Ti/Al/Ti, and the resistivity thereof is smaller (the resistivity of Al is $2.65\times10^{-6}$ $\Omega\cdot$cm, and the resistivity of Ti is $4.2\times10^{-5}$ $\Omega\cdot$cm), which can prevent the occurrence of horizontal stripe mura and improve the display effect. At the same time, the backplane according to the present embodiment has a simple structure, fabrication in the same layer does not need an additional process, and it does not have to significantly change the existing backplane fabricating process.

Various structures of the backplanes according to specific embodiments of the present disclosure will be described in detail below.

According to embodiments of the present disclosure, the specific material for the substrate 100 is not particularly limited, and those skilled in the art can make selection according to actual needs. For example, according to a specific embodiment of the present disclosure, the substrate 100 may be a glass substrate, a flexible substrate such as a polyimide (PI) substrate, or a laminating multilayer substrate including a PI layer. For example, the laminating multilayer substrate may be a substrate with an inorganic layer disposed between two PI layers, and the inorganic layer can be SiOx or SiNx.

According to embodiments of the present disclosure, the specific features, structures, materials, or characteristics of the wiring structure and the thin film transistor are not particularly limited, so long as it is satisfied that the initializing voltage input line 200 in the wiring structure is provided in the same layer and made of the same material as electrodes 300 of the thin film transistor. Here, the initializing voltage input line 200 is a signal line that inputs an initializing voltage signal generated from a peripheral driving circuit to a pixel driving circuit in the display area and thus provides an initializing voltage to the pixel driving circuit.

According to an embodiment of the present disclosure, referring to FIG. 2 to FIG. 5, the electrodes of the thin film transistor include a first electrode 310, a second electrode 320, and a control electrode 330. The initializing voltage input line 200 is provided in the same layer and made of the same material as the first electrode 310, the second electrode 320 or the control electrode 330. As such, the performance of the backplane can be further improved. According to an embodiment of the present disclosure, the initializing voltage input line 200 may be provided in the same layer and made of the same material as the first electrode 310 or the second electrode 320. As such, the initializing voltage input line 200 can be easily fabricated and the resistivity thereof is small, so that the occurrence of the horizontal stripe mura can be avoided.

Figure 2:
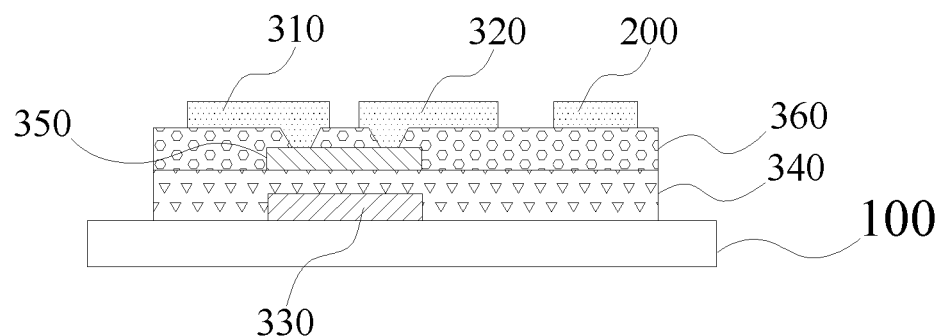
FIG. 2 shows a partial structural view of a backplane according to another embodiment of the present disclosure.
Figure 3A:
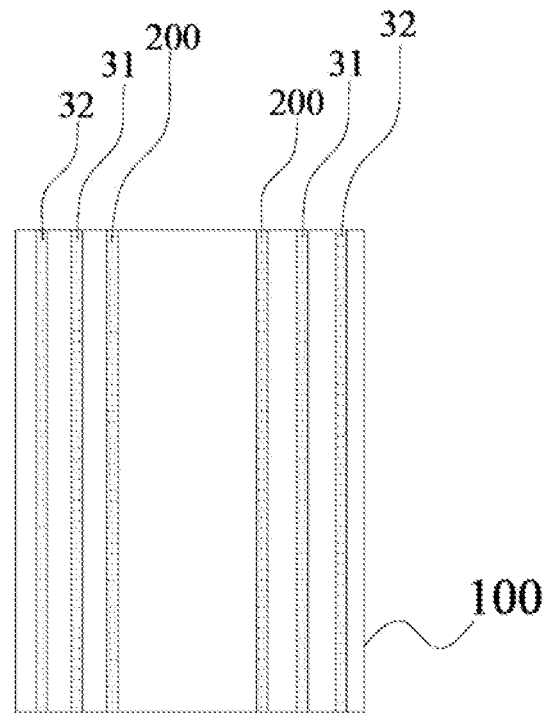
FIGS. 3A to 3C shows a partial structural view of a wiring structure of a backplane according to some embodiments of the present disclosure.
Figure 3B:
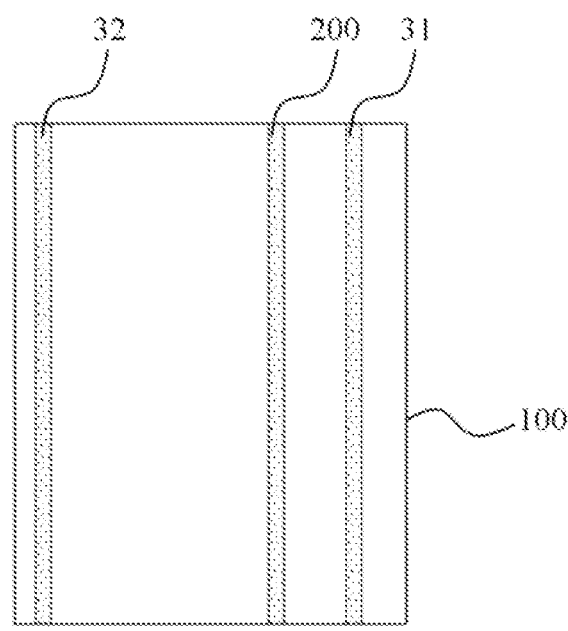

According to a specific embodiment of the present disclosure, referring to FIG. 2 (a sectional view of a backplane where there is a thin film transistor) and FIGS. 3A and 3B (a top view of a backplane at a wiring structure), the first and second electrodes 310 and 320 may be a source and a drain of the thin film transistor, respectively. The source and the drain may be provided in the same layer. The initializing voltage input line 200 is provided in the same layer and made of the same material as the first electrode 310 and the second electrode 320. It should be noted that in FIGS. 3A and 3B, the initializing voltage input line 200 is also provided in the same layer and made of the same material as the first electrode line 31 and the second electrode line 32, and an extension direction of the initializing voltage input line 200 is substantially the same as that of the first electrode line 31 and the second electrode line 32. The first electrode line 31 is used to be coupled to the first electrode 310, for example, the first electrode line 31 may be directly electrically coupled to the first electrode 310, or may be indirectly electrically coupled to the first electrode 310 via other conductive elements. The second electrode line 32 is used to be coupled to the second electrode 320, for example, the second electrode line 32 may be directly electrically coupled to the second electrode 320, or may be indirectly electrically coupled to the second electrode 320 via other conductive elements.

According to an embodiment of the present disclosure, as shown in FIGS. 3A and 3B, the first electrode line 31, the second electrode line 32, and the initializing voltage input line 200 constitute a repeating unit that is distributed in the display area. That is, the arrangement of the first electrode line 31, the second electrode line 32 and the initializing voltage input line 200 coupled to one pixel driving circuit and the arrangement of the first electrode line 31, the second electrode line 32 and the initializing voltage input line 200 coupled to another pixel driving circuit may be the same as or mirror images. According to an embodiment, for the first electrode line 31, the second electrode line 32, and the initializing voltage input line 200 coupled to the same pixel driving circuit, the initializing voltage input line 200 may be arranged between the first electrode line 31 and the second electrode line 31 (as shown in FIG. 3B), or may be arranged at a side of the first electrode line 31 away from the second electrode electrode line 32 (as shown in FIG. 3A), or may be arranged at a side of the second electrode line 32 away from the first electrode line 31 (not shown).

For example, when the thin film transistor is a switching transistor of the pixel driving circuit as discussed below, the first electrode line 31 may be a data line in the display area, and the second electrode line 32 may be a power signal line in the display area. In this case, the initializing voltage input line 200 may be adjacent to the data line and arranged on a side of the data line away from the power signal line (as shown in FIG. 3A), or may be arranged between the data line and the power signal line (as shown in FIG. 3B).

For another example, when the thin film transistor is a driving transistor of the pixel driving circuit as discussed below, the first electrode line 31 may be a power signal line in the display area, and the second electrode line 32 may be a data line in the display area. In this case, the initializing voltage input line 200 may be adjacent to the power signal line and arranged at a side of the power signal line away from the data line (as shown in FIG. 3A), or may be arranged between the power signal line and the data line (as shown in FIG. 3B).

Figure 4:
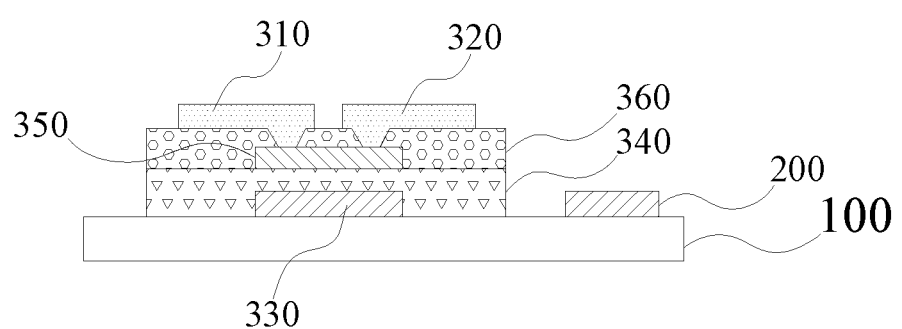
FIG. 4 shows a partial structural view of a backplane according to an embodiment of the present disclosure.
Figure 5:
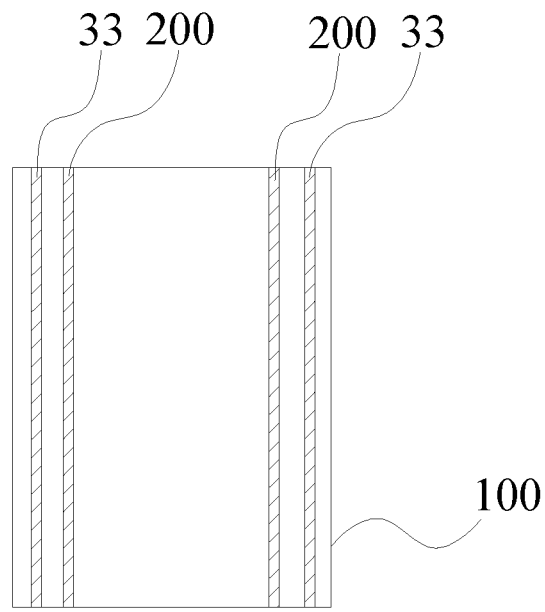
FIG. 5 shows a partial structural view of a wiring structure of a backplane according to an embodiment of the present disclosure.

According to an embodiment of the present disclosure, referring to FIG. 4 (a sectional view of a backplane where there is a thin film transistor) and FIG. 5 (a top view of a backplane at a wiring structure), the initializing voltage input line 200 may be provided in the same layer and made of the same material as the control electrode 330 (i.e., a gate of the thin film transistor). It should be noted that in FIG. 5, the initializing voltage input line 200 is also provided in the same layer and made of the same material as the control electrode line 33 (gate line). The control electrode line 33 is used to be coupled to the control electrode 330, and the extension direction of the initializing voltage input line 200 is substantially the same as that of the control electrode line 33. As such, the initializing voltage input line 200 can be easily fabricated and the resistivity thereof is small, so that the occurrence of horizontal stripe mura can be avoided.

According to an embodiment of the present disclosure, as discussed above, the thin film transistor may be a switching transistor of the pixel driving circuit, and the switching transistor includes a first electrode as a source, a second electrode as a drain, and a control electrode as a gate. The first electrode line 31 is a data line, and the second electrode line 32 is a power signal line. The first electrode is directly electrically coupled to the first electrode line 31. When the switching transistor is turned on in response to an electrical signal applied to the gate thereof, the first electrode transmits the data signal from the data line to the second electrode of the switching transistor. The second electrode is electrically coupled to other circuit elements of the pixel drive circuit. The initializing voltage input line 200, the data line, the first electrode, and the second electrode are arranged in the same layer and made of the same material, and the extension direction of the initializing voltage input line 200 is substantially the same as the extension direction of the data line. The second electrode line 32 is indirectly electrically coupled to the second electrode, that is, there are other electrical elements such as a capacitor, a thin film transistor between the second electrode and the second electrode line 32.

According to another embodiment of the present disclosure, as discussed above, the thin film transistor may be a driving transistor of the pixel driving circuit. The driving transistor includes a first electrode as a drain, a second electrode as a source, and a control electrode as a gate. The first electrode line 31 is a data line, and the second electrode line 32 is a power signal line. The first electrode is indirectly electrically coupled to the first electrode line 31, that is, the first electrode is indirectly electrically coupled to the first electrode line 31 via other circuit elements, and the second electrode is directly electrically coupled to the second electrode line 32. The initializing voltage input line 200 and the power signal line are arranged in the same layer and made of the same material, and the extension direction of the initializing voltage input line 200 is substantially the same as the extension direction of the power signal line.

According to yet another embodiment of the present disclosure, as discussed above, the thin film transistor may be a driving transistor of the pixel driving circuit. The driving transistor includes a first electrode as a source, a second electrode as a drain, and a control electrode as a gate. The first electrode line 31 is a power signal line, and the second electrode line 32 is a data line. The first electrode is directly electrically coupled to the first electrode line 31, that is, through a conductor. The second electrode is indirectly electrically coupled to the second electrode line 32, that is, there are other electrical elements such as a capacitor, a thin film transistor between the second electrode and the second electrode line 32. The initializing voltage input line 200, the power signal line, the first electrode, and the second electrode are arranged in the same layer and made of the same material, and the extension direction of the initializing voltage input line 200 is substantially the same as the extension direction of the power signal line.

According to an embodiment of the present disclosure, the second electrode (i.e., the drain) of the switching transistor may be directly electrically coupled to the control electrode (i.e., the gate) of the driving transistor.

According to an embodiment of the present disclosure, although not shown, the pixel driving circuit may further include a capacitor in addition to the above-mentioned switching transistor and driving transistor.

For example, the pixel driving circuit may include a first capacitor, and two plates of the first capacitor are respectively coupled to the gate of the driving transistor and the drain of the switching transistor. The pixel driving circuit may further include a second capacitor, and two plates of the second capacitor are respectively coupled to the gate and source of the driving transistor.

According to an embodiment of the present disclosure, the initializing voltage input line, the power signal line and the data line are arranged in the same layer and made of the same material, and the extension direction of the initializing voltage input line is substantially the same as the extension directions of the power signal line and the data line.

Figure 3C:
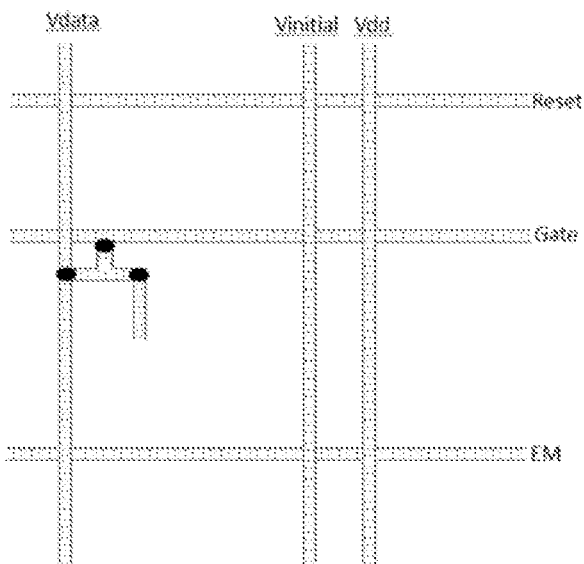

According to another embodiment of the present disclosure, as shown in FIG. 3C, the backplane of the organic light emitting display device may further include a reset control signal line Reset, a gate scan line Gate, and a light emission control signal line EM. The extension directions of the reset control signal line Reset, the gate scan line Gate, and the light emission control signal line EM are substantially the same, and cross, for example, are substantially perpendicular to, the extension direction of the initializing voltage input line 200. That is, the extension directions of the reset control signal line Reset, the gate scan line Gate, and the light emission control signal line EM are substantially perpendicular to the data line Vdata, the initializing voltage input line Vinitial and the power signal line Vdd. For convenience, only one switching transistor is shown in FIG. 3C, however the present disclosure is not limited thereto.

The backplane of the organic light emitting display device of the present disclosure may adopt a pixel driving circuit of 6T1C, 6T2C, 7T1C, or 8T1C. Taking the 7T1C pixel driving circuit as an example, the pixel driving circuit may include a switching transistor, a driving transistor, a compensation transistor, a driving control transistor, a light emission control transistor, a gate reset transistor, and an anode reset transistor. Of course, the backplane of the organic light emitting display device of the present disclosure may also be applied to other pixel driving circuits, which is within the protection scope of the present disclosure as long as the concept of the present disclosure is adopted.

According to embodiments of the present disclosure, the specific materials for forming the first electrode 310 and the second electrode 320 are not particularly limited, and those skilled in the art can make selection according to actual needs. For example, according to an embodiment of the present disclosure, the first electrode 310 and the second electrode 320 may be each and independently formed of at least one of titanium, chromium, molybdenum, tantalum, and aluminum. Thus, the above-described electrodes can be formed using the above-mentioned material having a low resistivity, so that the performance of the backplane can be further improved. According to an embodiment of the present disclosure, the first and second electrodes 310 and 320 may be each and independently formed of a composite material of multi metal layers, i.e., a structure having multi layers of metals, wherein each metal layer may be made of at least one of titanium, chromium, molybdenum, tantalum, and aluminum. Specifically, each metal layer may be independently formed of at least one of titanium, chromium, molybdenum, tantalum, aluminum, a titanium alloy, a chromium alloy, a molybdenum alloy, and a tantalum alloy. More specifically, the first electrode 310 and the second electrode 320 may be each and independently of a multi-layered composite structure formed of three metal layers of Ti/Al/Ti. According to an embodiment of the present disclosure, when the initializing voltage input line 200 is provided in the same layer and made of the same material as the first electrode 310 and the second electrode 320, the initializing voltage input line 200 may have the same features, structure, material or characteristics as the first electrode 310 and the second electrode 320.

According to embodiments of the present disclosure, the specific material for forming the control electrode 330 is not particularly limited, and those skilled in the art can make selection according to actual needs. For example, according to an embodiment of the present disclosure, the control electrode 330 may be formed of at least one of titanium, chromium, molybdenum, and tantalum. As such, the performance of the backplane can be further improved. Specifically, according to an embodiment of the present disclosure, the control electrode 330 may be made of molybdenum. According to an embodiment of the present disclosure, when the initializing voltage input line 200 is provided in the same layer and made of the same material as the control electrode 330, the initializing voltage input line 200 may have the same features, structure, material, or characteristic as the control electrode 330.

Figure 6:
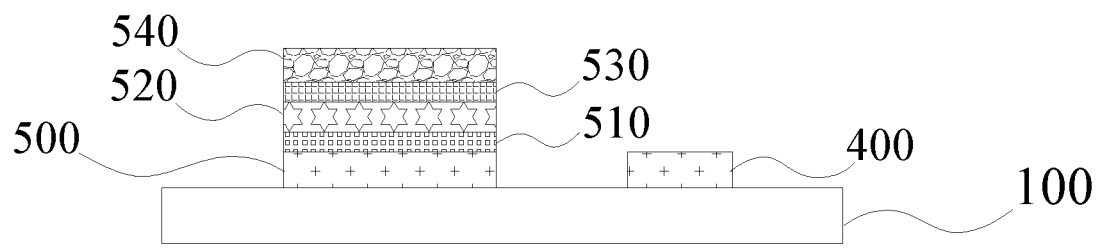
FIG. 6 shows a partial structural view of a backplane according to an embodiment of the present disclosure.
Figure 7:
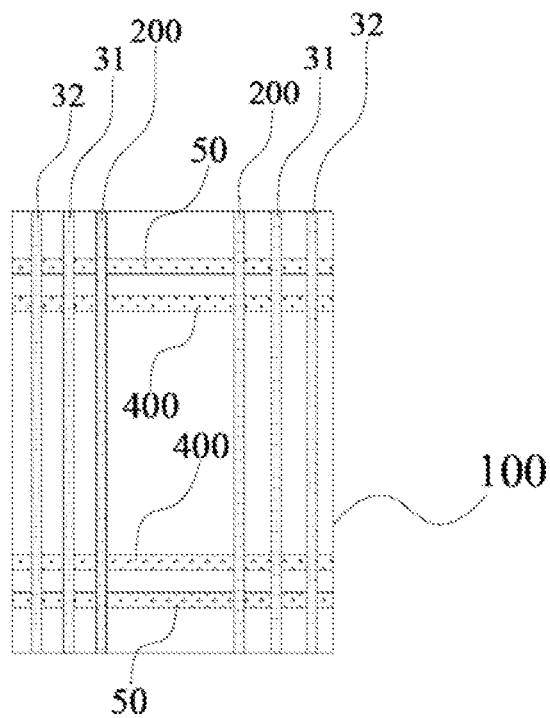
FIG. 7 shows a partial structural view of a wiring structure of a backplane according to an embodiment of the present disclosure.

According to an embodiment of the present disclosure, referring to FIG. 6 (a sectional structural view of a partial structure of a backplane), the backplane further includes an organic light emitting diode (e.g., an anode 500, a hole transport layer 510, a light emitting layer 520, an electron transport layer 530 and a cathode 540 shown in FIG. 6). The organic light emitting diode is provided on the substrate 100. The wiring structure further includes a reference voltage input line 400 which is provided in the same layer and made of the same material as the anode 500 of the organic light emitting diode. Thus, the reference voltage input line and the initializing voltage input line can be conveniently layered to further increase the opening ratio of the OLED. Specifically, referring to FIG. 7 (a top view of a partial wiring structure of the backplane) and taking it as an example that the initializing voltage input line 200 is provided in the same layer and made of the same material as the first electrode 310 and the second electrode 320, that is, the initializing voltage input line 200 is provided in the same layer and made of the same material as the first electrode line 31 and the second electrode line 32, and the reference voltage input line 400 is provided in the same layer and made of the same material as the anode line 50, wherein the anode line 50 is used to be coupled to the anode 500. In the existing backplane for an OLED display apparatus, the reference voltage input line 400 is usually provided in the same layer as the source and drain of the thin film transistor. According to an embodiment of the present disclosure, the reference voltage input line 400 is provided in the same layer and made of the same material as the anode 500 and the anode line 50, and the reference voltage input line 400 and the initializing voltage input line 200 can be made to be provided in different layers. Therefore, when the backplane is used to manufacture a high resolution product, the reference voltage input line 400 and the initializing voltage input line 200 may be made to be partially overlapped or completely overlapped in a direction perpendicular to the substrate, and thus the footprint area of the wiring structure may be reduced in case of dense pixel arrangement, further increasing the opening ratio of the OLED. In addition, the current applied to the reference voltage input line 400 is small, and thus the resistance of the wire itself has little influence on the voltage of the circuit and will not cause a significant fluctuation of the circuit voltage, so that even if the reference voltage input line 400 is formed using the anode layer material with a large resistance, the performance of the backplane will not be adversely affected.

According to embodiments of the present disclosure, the specific features, structures, materials, or characteristics of the aforesaid organic light emitting diode are not particularly limited, so long as it is satisfied that the reference voltage input line 400 is provided in the same layer and made of the same material as the anode 500 of the organic light emitting diode. According to embodiments of the present disclosure, the specific materials for forming the anode 500 and the reference voltage input line 400 are not particularly limited, and those skilled in the art can make selection according to actual needs. For example, according to an embodiment of the present disclosure, the anode 500 and the reference voltage input line 400 may each and independently be formed of a composite material of three metal layers of ITO/Ag/ITO.

Figure 8:
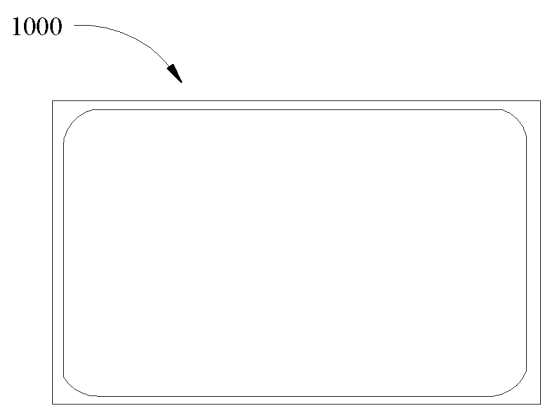
FIG. 8 shows a structural view of an organic light emitting display apparatus according to an embodiment of the present disclosure.

In another aspect of the present disclosure, referring to FIG. 8, the present disclosure provides an organic light emitting display apparatus 1000. According to an embodiment of the present disclosure, the organic light emitting display apparatus 1000 includes any of the aforementioned backplanes. Therefore, the organic light emitting display apparatus 1000 may have all the features and advantages of the backplane described above, which will not be repeated herein. In general, the organic light emitting display apparatus has at least one of the following advantages: the voltage signal of the initializing voltage input line is stable, which can significantly alleviate the horizontal stripe mura in the OLED; the structure of the backplane in the organic light emitting display apparatus is simple, and can be obtained through a simple fabricating process, without significant change of the existing backplane fabricating process.

In still another aspect of the present disclosure, the present disclosure provides a method of fabricating a backplane for an organic light emitting display device. According to an embodiment of the present disclosure, the backplane fabricated by the method may be the backplane described above, and thus may have all the features and advantages of the backplane described above, which will not be repeated herein. In general, with the method the initializing voltage input line and electrodes of the thin film transistor can be easily fabricated in the same layer and with the same material, without significant change of the existing backplane fabricating process. The voltage signal of the initializing voltage input line in the backplane fabricated by the method is stable, which can significantly alleviate the horizontal stripe mura in the OLED.

According to an embodiment of the present disclosure, the method includes: providing a wiring structure and a thin film transistor on a substrate, wherein the wiring structure includes an initializing voltage input line, and the initializing voltage input line and electrodes of the thin film transistor are formed through same one patterning process. As such, the initializing voltage input line and the electrodes of the thin film transistor can be easily fabricated in the same layer and with the same material, thereby reducing the fabrication cost.

The backplane fabricated by the method can significantly alleviate the horizontal stripe mura in the OLED. According to embodiments of the present disclosure, the specific manner of the patterning process is not particularly limited, so long as it is satisfied that the initializing voltage input line and the electrodes of the thin film transistor are formed in the same layer and made of the same material.

According to embodiments of the present disclosure, the specific material for forming the substrate is not particularly limited, and those skilled in the art can make selection according to actual needs. For example, according to a specific embodiment of the present disclosure, the substrate may be made of glass. According to embodiments of the present disclosure, the specific features, structures, materials, or characteristics of the wiring structure and the thin film transistor are not particularly limited, so long as it is satisfied that the initializing voltage input line in the wiring structure and the electrodes of the thin film transistor are formed through same one patterning process.

According to an embodiment of the present disclosure, the electrodes of the thin film transistor include a control electrode, a first electrode, and a second electrode. According to an embodiment of the present disclosure, the initializing voltage input line and the first electrode, the second electrode, or the control electrode are formed through same one patterning process. According to a specific embodiment of the present disclosure, the first electrode and the second electrode are provided in the same layer, and the initializing voltage input line and the first electrode and the second electrode are formed through the same one patterning process; or, according to an embodiment of the present disclosure, the initializing voltage input line and the control electrode are formed through the same one patterning process. As such, the initializing voltage input line can be easily fabricated and the resistivity thereof is small, so that the occurrence of horizontal stripe mura can be avoided.

According to embodiments of the present disclosure, the specific materials for forming the first electrode and the second electrode have been previously described in detail and will not be repeated herein. According to an embodiment of the present disclosure, when the initializing voltage input line is fabricated in the same layer and with the same material as the first and second electrodes, the initializing voltage input line may have the same features, structure, material, or characteristic as the first and second electrodes. According to embodiments of the present disclosure, specific materials for forming the control electrode have been previously described in detail and will not be repeated again herein. According to an embodiment of the present disclosure, when the initializing voltage input line and the control electrode are fabricated in the same layer and with the same material, the initializing voltage input line may have the same features, structure, material, or characteristics as the control electrode.

In order to further improve the performance of the backplane fabricated by the method, according to an embodiment of the present disclosure, the backplane further includes an organic light emitting diode which is provided on the substrate. The wiring structure further includes a reference voltage input line, and the reference voltage input line and the anode of the organic light emitting diode are formed through same one patterning process. As such, the reference voltage input line and the initializing voltage input line can be easily layered. According to embodiments of the present disclosure, the specific manner of the patterning process is not particularly limited, so long as it is satisfied that the reference voltage input line and the anode of the organic light emitting diode are formed in the same layer and by the same material.

In the existing backplane for an OLED display apparatus, the reference voltage input line is usually provided in the same layer as the source and drain of the thin film transistor. According to an embodiment of the present disclosure, the reference voltage input line and the anode are provided in the same layer and made of the same material, so that the reference voltage input line and the initializing voltage input line can be made layered. Therefore, when the backplane is used for manufacturing a high-resolution product, the reference voltage input line and the initializing voltage input line can be made partially overlapped or completely overlapped in a direction perpendicular to the substrate, so that the footprint area of the wiring structure may be reduced in case of dense pixel arrangement, further increasing the opening ratio of the OLED. In addition, the current applied to the reference voltage input line is small, and thus the resistance of the wire itself has little influence on the voltage of the circuit and will not cause a significant fluctuation of the circuit voltage, so that even if the reference voltage input line is formed using an anode layer material with a large resistance, the performance of the backplane will not be adversely affected.

According to embodiments of the present disclosure, the specific features, structures, materials, or characteristics of the organic light emitting diode are not particularly limited, so long as it is satisfied that the reference voltage input line and the anode of the organic light emitting diode are provided in the same layer and made of the same material. According to embodiments of the present disclosure, the specific materials for forming the anode and the reference voltage input line have been described in detail above, and will not be repeated herein.

According to the embodiments of the present invention, the initializing voltage input line may be arranged in only one direction, for example, extend only in the extension direction of the data line. Alternatively, the initializing voltage input line may be arranged in both directions, that is, not only in the direction in which the data line extends, but also in the direction to which the extension direction of the data line is perpendicular. Further, the initializing voltage input line may also be arranged in a mesh.

It shall be noted that the term "couple" used herein includes direct and indirect connections between elements.

In present disclosure, it describes above that two extension directions are substantially the same, which means that the two extension directions may have a deviation that is acceptable to those skilled in the art.

In summary, with the method the initializing voltage input line and the electrodes of thin film transistor can be easily fabricated in the same layer and with the same material, without significant change of the existing backplane fabricating process. The voltage signal of the initializing voltage input line in the backplane fabricated by the method is stable, which can significantly alleviate the horizontal stripe mura in the OLED.

As used in the description of the present disclosure, the terms "upper", "lower", and the like indicate the position or positional relationship based on the oriental or positional relationship shown in the drawings, are merely for facilitating the description of the present disclosure rather than requiring that the present disclosure must be configured and operated in the specific orientation, and accordingly are not to be construed as limiting the present disclosure.

As used in the description of the present disclosure, the description referring to the terms "an embodiment", "another embodiment" and the like means that the specific features, structures, materials or characteristics described in connection with the embodiment are included in at least one embodiment of the present disclosure. In this disclosure, the schematic representation of the above terms does not necessarily refer to the same embodiment or example. Furthermore, the described particular features, structures, materials, or characteristics may be combined in any suitable manner in any one or more of the embodiments or examples. In addition, those skilled in the art may combine and compose the different embodiments or examples described in this disclosure and features of different embodiments or examples without conflicting with each other. In addition, it should be noted that as used in this disclosure, the terms "first" and "second" and the like are used for purpose of description only, and cannot be interpreted as indicating or implying relative importance or implicitly indicating number of indicated technical features.

Although embodiments of the present disclosure have been shown and described above, it will be understood that the above embodiments are exemplary and are not to be construed as limiting the present disclosure, and that those skilled in the art may make variations, modifications, substitutions and changes to the above embodiments within the scope of the present disclosure.

What is claimed is:

1. An organic light emitting display device, comprising a substrate, an initializing voltage input line, a first electrode line, a thin film transistor, and an organic light emitting diode arranged on the substrate, wherein
the thin film transistor comprises a first electrode, a second electrode and a control electrode, and the first electrode is coupled to the first electrode line,
the initializing voltage input line is provided in the same layer and is made of the same material as one of the first electrode, the second electrode and the control electrode of the thin film transistor, and
an extension direction of the initializing voltage input line is substantially the same as an extension direction of the first electrode line.

2. The organic light emitting display device according to claim 1, wherein the first electrode line is a data line of the organic light emitting display device, and the extension direction of the initializing voltage input line is substantially the same as an extension direction of the data line.

3. The organic light emitting display device according to claim 1, wherein the first electrode line is a power signal line of the organic light emitting display device, and the extension direction of the initializing voltage input line is substantially the same as an extension direction of the power signal line.

4. The organic light emitting display device according to claim 1, wherein the first electrode line is one of a data line and a power signal line of the organic light emitting display device, and the extension direction of the initializing voltage input line is substantially the same as extension directions of the data line and the power signal line.

5. The organic light emitting display device according to claim 1, wherein the organic light emitting display device further comprises a scan line, and the extension direction of the initializing voltage input line is substantially perpendicular to an extension direction of the scan line.

6. The organic light emitting display device according to claim 5, wherein the organic light emitting display device further comprises a reset signal line and a light emission control signal line, and extension directions of the reset signal line and the light emission control signal line are substantially the same as the extension direction of the scan line.

7. The organic light emitting display device according to claim 1, wherein the first electrode and the second electrode of the thin film transistor are a source and a drain respectively, and the initializing voltage input line is provided in the same layer and is made of the same material as the first electrode and the second electrode.

8. The organic light emitting display device according to claim 1, wherein the control electrode of the thin film transistor is a gate, and the initializing voltage input line is provided in the same layer and is made of the same material as the control electrode.

9. The organic light emitting display device according to claim 1, wherein the thin film transistor is a switching transistor in a pixel driving circuit of the organic light emitting display device, and the first electrode line is a data line of the organic light emitting display device.

10. The organic light emitting display device according to claim 9, wherein the initializing voltage input line and the data line are coupled to the same pixel driving circuit and are arranged adjacent to each other.

11. The organic light emitting display device according to claim 9, wherein the organic light emitting display device further comprises a power signal line extending in substantially the same direction as the initializing voltage input line and the data line, and the data line, the initializing voltage input line and the power signal line are coupled to the same pixel driving circuit.

12. The organic light emitting display device according to claim 11, wherein the initializing voltage input line and the data line are arranged adjacent to each other, and the data line is arranged between the initializing voltage input line and the power signal line.

13. The organic light emitting display device according to claim 11, wherein the initializing voltage input line and the data line are arranged adjacent to each other, and the initializing voltage input line is arranged between the power signal line and the data line.

14. The organic light emitting display device according to claim 9, wherein the first electrode and the second electrode of the switching transistor, the initializing voltage input line and the data line are arranged in the same layer and made of the same material.

15. The organic light emitting display device according to claim 9, wherein the pixel driving circuit of the organic light emitting display device further comprises a driving transistor and a first capacitor, and two plates of the first capacitor are respectively coupled to a control electrode of the driving transistor and the second electrode of the switching transistor.

16. The organic light emitting display device according to claim 15, wherein the pixel driving circuit of the organic light emitting display device further comprises a second capacitor, and two plates of the second capacitor are respectively coupled to the control electrode and a first electrode of the driving transistor.

17. The organic light emitting display device according to claim 1, wherein the thin film transistor is a driving transistor in a pixel driving circuit of the organic light emitting display device, and the first electrode line is a power signal line of the organic light emitting display device.

18. The organic light emitting display device according to claim 17, wherein the initializing voltage input line and the power signal line are coupled to the same pixel driving circuit and are arranged adjacent to each other.

19. The organic light emitting display device according to claim 17, wherein the first electrode and the second electrode of the driving transistor, the initializing voltage input line and the power signal line are arranged in the same layer and made of the same material.

20. The organic light emitting display device according to claim 1, wherein the initializing voltage input line and the one of the first electrode, the second electrode and the control electrode of the thin film transistor are formed by a same patterning process.

* * * * *